United States Patent
Choi et al.

(10) Patent No.: US 11,097,521 B2
(45) Date of Patent: Aug. 24, 2021

(54) OLED PANEL BOTTOM PROTECTION FILM, AND ORGANIC LIGHT-EMITTING DISPLAY DEVICE COMPRISING SAME

(71) Applicant: Samsung Display Co., Ltd., Yongin-si (KR)

(72) Inventors: Youngseo Choi, Yongin-si (KR); Dongwon Han, Yongin-si (KR); Sangshin Kim, Asan-si (KR); Jinhyuk Kim, Asan-si (KR); Youngdon Park, Asan-si (KR); Youngbin Baek, Asan-si (KR); Sangwoo Lee, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 16/479,187

(22) PCT Filed: Jan. 18, 2018

(86) PCT No.: PCT/KR2018/000823
§ 371 (c)(1),
(2) Date: Jul. 18, 2019

(87) PCT Pub. No.: WO2018/135866
PCT Pub. Date: Jul. 26, 2018

(65) Prior Publication Data
US 2019/0386247 A1    Dec. 19, 2019

(30) Foreign Application Priority Data
Jan. 18, 2017    (KR) .................. 10-2017-0008539

(51) Int. Cl.
*B32B 7/12* (2006.01)
*B32B 27/30* (2006.01)
(Continued)

(52) U.S. Cl.
CPC .............. *B32B 27/308* (2013.01); *B32B 7/06* (2013.01); *B32B 7/12* (2013.01); *B32B 27/36* (2013.01);
(Continued)

(58) Field of Classification Search
CPC ........ B32B 27/308; C08F 20/00; C08F 20/10; C08F 20/12; C08F 20/14; C08F 120/00;
(Continued)

(56) References Cited

U.S. PATENT DOCUMENTS 9,897,835 B2    2/2018  Song
10,374,190 B2   8/2019  Tazaki et al.
(Continued)

FOREIGN PATENT DOCUMENTS

CN    101155890 A    4/2008
CN    105830533 A    8/2016
(Continued)

OTHER PUBLICATIONS

Extended European Search Report dated Oct. 9, 2020 for European Application No. EP 18741571.6, 6 pages.

*Primary Examiner* — Zachary M Davis
(74) *Attorney, Agent, or Firm* — Lewis Roca Rothgerber Christie LLP

(57) ABSTRACT

A bottom protection film for an OLED panel is provided. More particularly, a bottom protection film for an OLED panel, the bottom protection film having excellent bending performance due to elasticity and impact resistance, excellent alignment process workability, and excellent adhesion to an OLED panel, and being capable of preventing generation of static electricity through performing an antistatic treatment is provided.

21 Claims, 3 Drawing Sheets

(51) Int. Cl.
| | |
|---|---|
| *B32B 7/06* | (2019.01) |
| *B32B 27/36* | (2006.01) |
| *H01L 23/60* | (2006.01) |
| *H01L 51/00* | (2006.01) |
| *H01L 51/52* | (2006.01) |
| *H01L 51/56* | (2006.01) |
| *B32B 37/12* | (2006.01) |

(52) U.S. Cl.
CPC .............. *H01L 23/60* (2013.01); *H01L 51/00* (2013.01); *H01L 51/003* (2013.01); *H01L 51/52* (2013.01); *H01L 51/5253* (2013.01); *H01L 51/56* (2013.01); *B32B 2037/1269* (2013.01); *B32B 2255/10* (2013.01); *B32B 2307/21* (2013.01); *B32B 2307/54* (2013.01); *B32B 2307/732* (2013.01); *B32B 2307/748* (2013.01); *B32B 2367/00* (2013.01); *B32B 2457/206* (2013.01); *H01L 2251/5392* (2013.01); *H01L 2251/556* (2013.01); *H01L 2251/558* (2013.01)

(58) Field of Classification Search
CPC .... C08F 120/10; C08F 120/12; C08F 120/14; C08F 220/00; C08F 220/10; C08F 220/12; C08F 220/14; C08L 33/00; C08L 33/04; C08L 33/10; C08L 33/12; H01L 23/60; H01L 51/00; H01L 51/003; H01L 51/52; H01L 51/5253; H01L 51/5256
See application file for complete search history.

(56) References Cited

U.S. PATENT DOCUMENTS

| | | | |
|---|---|---|---|
| 2009/0022967 A1 | 1/2009 | Inenaga | |
| 2013/0323521 A1* | 12/2013 | Xia | ........................ C09J 133/14 428/523 |
| 2014/0091288 A1 | 4/2014 | Lee et al. | |
| 2015/0037526 A1* | 2/2015 | Seth | ........................ C08K 7/28 428/41.3 |

FOREIGN PATENT DOCUMENTS

| | | |
|---|---|---|
| JP | 1-302339 A | 12/1989 |
| JP | 2000-297260 A | 10/2000 |
| JP | 2005-298703 A | 10/2005 |
| KR | 10-0252953 B1 | 4/2000 |
| KR | 10-2007-0069580 A | 7/2007 |
| KR | 10-2007-0101711 A | 10/2007 |
| KR | 10-2014-0043022 A | 4/2014 |
| KR | 10-2015-0117760 A | 10/2015 |
| KR | 10-1801690 B1 | 11/2017 |
| WO | WO 2012/112856 A1 | 8/2012 |

* cited by examiner

OLED PANEL BOTTOM PROTECTION FILM, AND ORGANIC LIGHT-EMITTING DISPLAY DEVICE COMPRISING SAME

CROSS-REFERENCE TO RELATED APPLICATION(S)

This application is a National Phase Patent Application of International Patent Application Number PCT/KR2018/000823, filed on Jan. 18, 2018, which claims priority of Korean Patent Application No. 10-2017-0008539, filed Jan. 18, 2017. The entire contents of all of which are incorporated herein by reference.

TECHNICAL FIELD

The present disclosure relates to a bottom protection film for an OLED panel, and more particularly, to a bottom protection film for an OLED panel, the bottom protection film having excellent bending performance due to elasticity and impact resistance, excellent alignment process workability, and excellent adhesion to an OLED panel, and being capable of preventing generation of static electricity through performing an antistatic treatment.

BACKGROUND ART

Recently, flat panel displays have been gaining attention as a display device according to the remarkable progress in information communication technology and expansion of the market. Examples of the flat panel displays include liquid crystal displays, plasma display panels, and organic light emitting diodes.

Organic light emitting devices have advantages such as a high response speed, a light weight, a small thickness, a compact size, low power consumption, self-emitting characteristics, and flexible characteristics, and thus are increasingly in demand for next-generation display devices and flexible displays, and even in illumination.

An organic light emitting device is manufactured by sequentially depositing, on a glass substrate, a transparent electrode, a hole injection layer, a hole transport layer, an organic emitting layer, an electron transport layer, an electron injection layer, and a metal electrode in an order, and emits light based on the principle that light is emitted by using energy discharged when electrons and holes supplied from both electrodes recombine in the organic emitting layer.

An organic light-emitting device is likely to deteriorate due to external factors such as external humidity, oxygen or ultraviolet rays, and thus a packaging technique of encapsulating the organic light emitting device is essential, and for applications over a broad range, an organic light-emitting device is required to be thin.

Meanwhile, a bottom protection film is included under an OLED panel to protect the OLED panel, and a bottom protection film for an OLED panel according to the related art has poor elasticity and impact resistance, and is thus not applicable to a flexible display and limited in its application fields, involved a high defect rate due to poor alignment process workability, generation of static electricity could not be prevented, and adhesion to the OLED panel was poor.

Thus, there is the pressing need for research into a bottom protection film for an OLED panel, the bottom protection film having excellent bending performance due to elasticity and impact resistance, excellent alignment process workability, and excellent adhesion to an OLED panel, wherein generation of static electricity may be prevented through performing an antistatic treatment at the same time.

DESCRIPTION OF EMBODIMENTS

TECHNICAL PROBLEM

The present disclosure provides a bottom protection film for an OLED panel, the bottom protection film having excellent bending performance due to elasticity and impact resistance, excellent alignment process workability, and excellent adhesion to an OLED panel, wherein generation of static electricity may be prevented through performing an antistatic treatment at the same time.

SOLUTION TO PROBLEM

According to an aspect of the present disclosure, there is provided a bottom protection film for OLED panel, including: a base film including a first adhesive layer formed on an upper surface of a first base material; a carrier film including a second adhesive layer adhered to a lower surface of the first base material and a second base material adhered to a lower surface of the second adhesive layer; and a liner film adhered using the first adhesive layer, wherein the first adhesive layer satisfies all of Conditions (1), (2), and (3) below.

$$\text{At } 25^\circ \text{C.}, 0.28 \leq \frac{\text{loss modulus (Pa)}}{\text{storage modulus (Pa)}} \leq 0.8 \quad (1)$$

$$\text{at } 50^\circ \text{C.}, 0.23 \leq \frac{\text{loss modulus (Pa)}}{\text{storage modulus (Pa)}} \leq 0.53 \quad (2)$$

$$\text{at } 85^\circ \text{C.}, 0.35 \leq \frac{\text{loss modulus (Pa)}}{\text{storage modulus (Pa)}} \leq 0.6. \quad (3)$$

ADVANTAGEOUS EFFECTS OF DISCLOSURE

A bottom protection film for an OLED panel of the present disclosure may have excellent bending performance due to elasticity and impact resistance, excellent alignment process workability, and excellent adhesion to an OLED panel, wherein generation of static electricity may be prevented through performing an antistatic treatment at the same time.

BEST MODE

Figure 1:
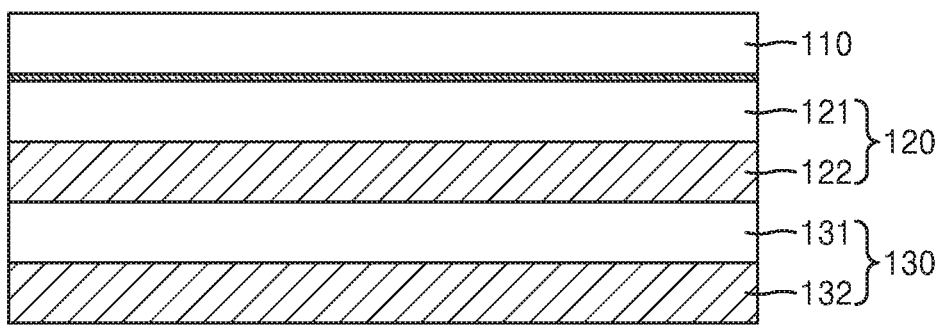
FIG. 1 is a cross-sectional view of a bottom protection film for an OLED panel, according to an embodiment of the present disclosure.

According to an embodiment of the present disclosure, a bottom protection film for an OLED panel is provided, the bottom protection film including: a base film including a first adhesive layer formed on an upper surface of a first base material; a carrier film including a second adhesive layer adhered to a lower surface of the first base material and a second base material adhered to a lower surface of the second adhesive layer; and a liner film adhered using the first adhesive layer, wherein the first adhesive layer satisfies all of Conditions (1), (2), and (3) below.

$$\text{At } 25°\text{C.}, 0.28 \leq \frac{\text{loss modulus (Pa)}}{\text{storage modulus (Pa)}} \leq 0.8, \quad (1)$$

$$\text{at } 50°\text{C.}, 0.23 \leq \frac{\text{loss modulus (Pa)}}{\text{storage modulus (Pa)}} \leq 0.53, \quad (2)$$

$$\text{at } 85°\text{C.}, 0.35 \leq \frac{\text{loss modulus (Pa)}}{\text{storage modulus (Pa)}} \leq 0.6. \quad (3)$$

Also, according to an embodiment, the first adhesive layer may satisfy all of Conditions (1), (2), and (3) below:

$$\text{At } 25°\text{C.}, 0.36 \leq \frac{\text{loss modulus (Pa)}}{\text{storage modulus (Pa)}} \leq 0.65, \quad (1)$$

$$\text{at } 50°\text{C.}, 0.28 \leq \frac{\text{loss modulus (Pa)}}{\text{storage modulus (Pa)}} \leq 0.46, \quad (2)$$

$$\text{at } 85°\text{C.}, 0.39 \leq \frac{\text{loss modulus (Pa)}}{\text{storage modulus (Pa)}} \leq 0.54. \quad (3)$$

Also, the first adhesive layer may have, at 25° C., a storage modulus of 20,000 to 28,000 Pa and a loss modulus of 8,000 to 16,000 Pa.

Also, the first adhesive layer may have, at 50° C., a storage modulus of 33,000 to 41,000 Pa and a loss modulus of 9,500 to 17,500 Pa.

Also, the first adhesive layer may have, at 85° C., a storage modulus of 44,500 to 52,500 Pa and a loss modulus of 18,500 to 26,500 Pa.

Also, the first base material and the second base material may each be a PET base material, and the first adhesive layer and the second adhesive layer may be acrylic adhesive layers.

Also, a lower surface of the liner film may be silicon release treated.

Also, at least one surface of each of the liner film, the first base material, and the second base material may be antistatic treated.

Also, the first adhesive layer and the second adhesive layer may include an antistatic agent.

Also, the first adhesive layer may have a thickness of 10 to 30 μm, and the first base material may have a thickness of 65 to 140 μm.

Also, the liner film may have a thickness of 55 to 95 μm, and the second adhesive layer may have a thickness of 1 to 10 μm, and the second base material may have a thickness of 20 to 60 μm.

Also, a releasing force of the liner film may be 5 gf/in or less.

Also, an adhesion of the first adhesive layer measured by using a measurement method below may be 250 gf/in or higher.

[Measurement Method]

The first adhesive layer was adhered to glass, and after 24 hours, an adhesion of the first adhesive layer was measured when the first adhesive layer was exfoliated at 180° at a rate of 5 mm per second.

Also, an exfoliation force between the base film and the carrier film may be 3 to 10 gf/in.

According to an embodiment of the present disclosure, a method of applying a bottom protection film for an OLED panel is provided, the method including: exfoliating a liner film from the bottom protection film for an OLED panel; attaching a base film and a carrier film, from which the liner film is exfoliated, to the OLED panel; and exfoliating the carrier film from the base film and the carrier film that are attached to the OLED panel.

According to an embodiment of the present disclosure, an organic light-emitting display device including the base film described above is provided.

Mode of Disclosure

Hereinafter, embodiments of the present disclosure will be described in detail with reference to the accompanying drawings, which will be readily apparent to those skilled in the art to which the present disclosure pertains. The present disclosure may be embodied in many different forms and should not be construed as limited to the embodiments set forth herein. In the drawings, portions unrelated to the description are omitted for clarity of the present disclosure, and like reference numerals refer to like elements throughout.

As illustrated in FIG. 1, a bottom protection film for an OLED panel according to an embodiment of the present disclosure includes a base film 120 including a first adhesive layer 121 formed on an upper surface of a first base material 122, a carrier film 130 including a second adhesive layer 131 adhered to a lower surface of the first base material 122 and a second base material 132 adhered to a lower surface of the second adhesive layer 131, and a liner film 110 adhered using (adhered to and using) the first adhesive layer 121.

Before describing each layer constituting the bottom protection film for an OLED panel according to the present disclosure as illustrated in FIG. 1, the reason why the first adhesive layer 121 of the base film 120 of the present disclosure has to satisfy Conditions (1), (2), and (3) below will be described first.

In an OLED panel, to the bottom of which a protection film is attached, when a modulus of the protection film is low, bubbles may be present between the OLED panel and the protection film, and this may lower an adhesion to the OLED panel. When applying a protection film by stamping the protection film, an adhesive layer included in the protection layer may partially protrude to the outside, and since bending performance is poor due to poor elasticity, the protection film is not applicable to flexible products such as flexible displays, and impact resistance is also not good. Also, when a modulus of the protection film is high, an adhesive layer included in the protection film is excessively hard, and thus a targeted adhesion may not be obtained.

Accordingly, the bottom protection film for an OLED panel should have an appropriate modulus. The first adhesive layer 121 of the base film 120 of the bottom protection film for an OLED panel according to the present disclosure satisfies all of Conditions (1), (2), and (3) below to resolve the problems as described above.

Condition (1) may be, at 25° C., $$0.28 \leq \frac{\text{loss modulus (Pa)}}{\text{storage modulus (Pa)}} \leq 0.8,$$

preferably, $$0.36 \leq \frac{\text{loss modulus (Pa)}}{\text{storage modulus (Pa)}} \leq 0.65.$$

Condition (2) may be, at 50° C., $$0.23 \leq \frac{\text{loss modulus (Pa)}}{\text{storage modulus (Pa)}} \leq 0.53,$$

preferably, $$0.28 \leq \frac{\text{loss modulus (Pa)}}{\text{storage modulus (Pa)}} \leq 0.46.$$

Condition (3) may be, at 85° C., $$0.35 \leq \frac{\text{loss modulus (Pa)}}{\text{storage modulus (Pa)}} \leq 0.6,$$

preferably $$0.39 \leq \frac{\text{loss modulus (Pa)}}{\text{storage modulus (Pa)}} \leq 0.54.$$

In Condition (1), when a ratio of a loss modulus to a storage modulus is less than 0.28, an adhesion of the base film at 25° C. may be poor, and when the ratio exceeds 0.8, elasticity and bending performance of the base film at 25° C. may be poor. Also, in Condition (2), when a ratio of a loss modulus to a storage modulus is less than 0.23, an adhesion of the base film at 50° C. may be poor, and when the ratio exceeds 0.53, elasticity and bending performance of the base film at 50° C. may be poor. Also, in Condition (3), when a ratio of a loss modulus to a storage modulus is less than 0.35, an adhesion of the base film at 85° C. may be poor, and when the ratio exceeds 0.6, elasticity and bending performance of the base film at 85° C. may be poor.

Hereinafter, components included in the bottom protection film for an OLED panel will be described in detail.

First, the liner film 110 will be described.

The liner film 110 has a function of protecting an upper surface of the base film 120. In a process of attaching a bottom protection film for an OLED panel according to the present disclosure, to an OLED panel, an alignment process may be performed, and in this case, the liner film 110 is first exfoliated, and then the base film 120 and the carrier film 130 may be attached to the OLED panel.

In addition, in order to prevent exfoliation between the base film 120 and the carrier film 130 while exfoliating the liner film 110, a releasing force of the liner film 110 may be relatively small compared to an exfoliation force between the base film 120 and the carrier film 130, and a releasing force of the liner film 110 may preferably be 5 gf/in or less, more preferably, 2 to 4 gf/in. When the releasing force of the liner film 110 exceeds 5 gf/in, and when exfoliating the liner film 110 from the upper surface of the base film 120, exfoliation between the base film 120 and the carrier film 130 may be generated, and this may significantly increase a defect rate.

Figure 2:
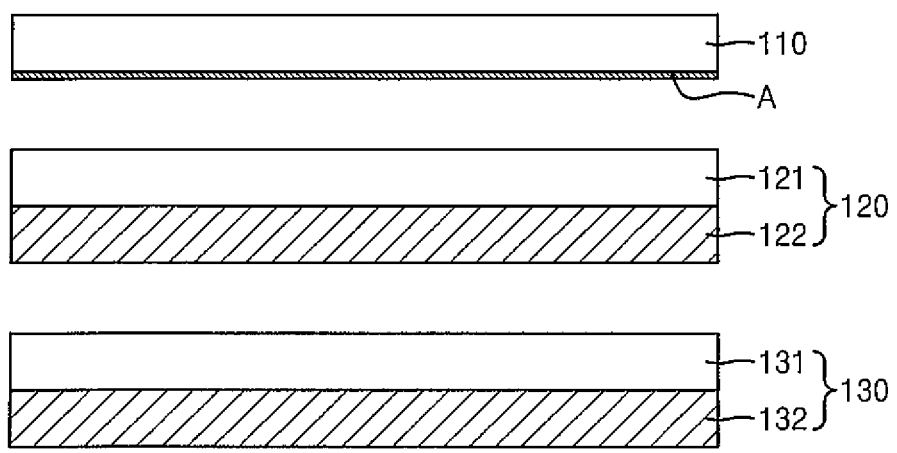
FIG. 2 is a disassembled cross-sectional view of a bottom protection film for an OLED panel, according to an embodiment of the present disclosure.

As illustrated in FIG. 2, in order for a liner film 110 to exhibit a releasing force as described above, a lower surface of the liner film 110 may be release-treated (A). In the release treatment above, any material that is typically used in release treatment may be used without limitation, and preferably, releasing may be performed using silicon to exhibit an appropriate level of releasing force.

Meanwhile, to prevent generation of static electricity, at least a surface of the liner film 110 according to the present disclosure, preferably upper and lower surfaces thereof, may be antistatic treated. Through such an antistatic treatment, generation of static electricity may be prevented and alignment process workability may be enhanced.

Any material that is typically used in a liner film in the art may be used as the liner film 110 without limitation, and preferably, a PET base material may be used. Also, a thickness of the liner film 110 is not limited as long as the thickness is a thickness of a liner film that may be typically used in a protection film, and may preferably be 55 to 95 μm, more preferably 60 to 90 μm, but is not limited thereto.

Next, the base film 120 will be described.

The base film 120 includes the first adhesive layer 121 formed on the upper surface of the first base material 122. The base film 120 is directly attached to an OLED panel and has a function of protecting the bottom of the OLED panel. In a process of attaching a bottom protection film for an OLED panel according to the present disclosure, to an OLED panel, an alignment process may be performed, and in this case, the liner film 110 is first exfoliated, and then the base film 120 and the carrier film 130 are attached to the OLED panel, and then the carrier film 130 may be exfoliated to locate a protection film on the bottom of the OLED panel.

Here, an adhesion of the base film 120 is to be sufficiently great so that the protection film attached to the bottom of the OLED panel is not exfoliated, and preferably, the adhesion measured using a measurement method below may be 250 gf/in or higher, more preferably, the adhesion may be 1000 to 2300 gf/in.

[Measurement Method]

The first adhesive layer was adhered to glass, and after 24 hours, an adhesion thereof was measured when the first adhesive layer was exfoliated at 180° at a rate of 5 mm per second.

When an adhesion of the base film 120 measured using the measurement method is less than 250 gf/in, the base film 120 may be exfoliated from the OLED panel.

Meanwhile, the first adhesive layer 121 of the base film 120 according to the present disclosure may have, at 25° C., a storage modulus of 20,000 to 28,000 Pa, preferably, 21,000 to 27,000 Pa, and a loss modulus of 8,000 to 16,000 Pa, preferably, 9,000 to 15,000 Pa.

When a storage modulus of the first adhesive layer 121 of the base film 120 at 25° C. is less than 20,000 Pa, when attaching the base film 120 to an OLED panel, bubbles may be formed between the OLED panel and the base film 120 at 25° C., and impact resistance thereof may be poor, and elasticity thereof is poor, and thus bending performance thereof may be poor. In addition, when a storage modulus of the first adhesive layer 121 of the base film 120 at 25° C. exceeds 28,000 Pa, the first adhesive layer 121 of the base film 120 at 25° C. may be excessively hard, and an adhesion thereof may be poor. Also, when the loss modulus of the first adhesive layer 121 of the base film 120 at 25° C. is less than 8,000 Pa, the adhesion of the first adhesive layer 121 at 25° C. may be poor, and when the loss modulus of the first adhesive layer 121 of the base film 120 at 25° C. exceeds 16,000 Pa, the adhesion thereof may be excessively high, and accordingly, when an error occurs in an alignment process, reprocessing may be difficult, and there may be residue when the base film 120 is exfoliated from the OLED panel.

When a storage modulus of the first adhesive layer 121 of the base film 120 at 50° C. is less than 33,000 Pa, and when attaching the base film 120 to an OLED panel, bubbles may be formed between the OLED panel and the base film 120 at 50° C., and impact resistance thereof may be poor, and elasticity thereof is poor, and thus bending performance thereof may be poor. In addition, when a storage modulus of the first adhesive layer 121 of the base film 120 at 50° C. exceeds 41,000 Pa, the first adhesive layer 121 of the base film 120 at 50° C. may be excessively hard, and an adhesion thereof may be poor. Also, when the loss modulus of the first adhesive layer 121 of the base film 120 at 50° C. is less than 9,500 Pa, the adhesion of the first adhesive layer 121 at 50° C. may be poor, and when the loss modulus of the first adhesive layer 121 of the base film 120 at 50° C. exceeds 17,500 Pa, the adhesion thereof may be excessively high, and accordingly, when an error occurs in an alignment process, reprocessing may be difficult, and there may be residue when the base film 120 is exfoliated from the OLED panel.

When a storage modulus of the first adhesive layer 121 of the base film 120 at 85° C. is less than 44,500 Pa, and when attaching the base film 120 to an OLED panel, bubbles may be formed between the OLED panel and the base film 120 at 85° C., and impact resistance thereof may be poor, and elasticity thereof is poor, and thus bending performance thereof may be poor. In addition, when a storage modulus of the first adhesive layer 121 of the base film 120 at 85° C. exceeds 52,500 Pa, the first adhesive layer 121 of the base film 120 at 85° C. may be excessively hard, and an adhesion thereof may be poor. Also, when the loss modulus of the first adhesive layer 121 of the base film 120 at 85° C. is less than 18,500 Pa, the adhesion of the first adhesive layer 121 at 85° C. may be poor, and when the loss modulus of the first adhesive layer 121 of the base film 120 at 85° C. exceeds 26,500 Pa, the adhesion thereof may be excessively high, and accordingly, when an error occurs in an alignment process, reprocessing may be difficult, and there may be residue when the base film 120 is exfoliated from the OLED panel.

The first adhesive layer 121 included in the base film 120 according to the present disclosure may include an antistatic agent to prevent generation of static electricity. By including the antistatic agent, generation of static electricity may be prevented, and alignment process workability may be enhanced.

As the first adhesive layer 121 included in the base film 120, any material for typically forming an adhesive layer in the art may be used without limitation, and the first adhesive layer 121 may preferably be an acrylic adhesive layer. In addition, a thickness of the first adhesive layer 121 is not limited as long as the thickness is a thickness of an adhesive layer typically included in a protection film, and may preferably be 10 to 30 μm, more preferably, 12 to 26 μm.

Detailed description of the first adhesive layer 121 will be provided with reference to a manufacturing method which will be described later.

Any material that is typically used in a protection film in the art may be used as the first base material 122 without limitation, and preferably, a PET base material may be used. Also, a thickness of the first base material 122 is not limited as long as the thickness is a thickness of a base material that may be typically used in a protection film, and may preferably be 65 to 140 μm, more preferably 70 to 130 μm, but is not limited thereto.

Meanwhile, to prevent generation of static electricity, at least a surface of the first base material 122 according to the present disclosure, preferably a lower surface thereof, may be antistatic treated. Through antistatic treatment, generation of static electricity may be prevented, and alignment process workability may be enhanced.

Next, the carrier film 130 will be described.

The carrier film 130 includes the second adhesive layer 131 adhered to the lower surface of the first base material 122 and the second base material 132 adhered to the lower surface of the second adhesive layer 131.

The carrier film 130 has a function of protecting the bottom of the base film 120 that is directly attached to the OLED panel. In a process of attaching a bottom protection film for an OLED panel according to the present disclosure, to an OLED panel, an alignment process may be performed, and in this case, the liner film 110 is first exfoliated, and then the base film 120 and the carrier film 130 are attached to the OLED panel, and then the carrier film 130 may be exfoliated to locate a protection film on the bottom of the OLED panel.

In an operation of exfoliating the liner film 110 first, then attaching the base film 120 and the carrier film 130 to the OLED panel, and then exfoliating the carrier film 130, in order to prevent exfoliation between the OLED panel and the base film 120, an exfoliation force between the base film 120 and the carrier film 130 may be sufficiently small compared to an adhesion of the first adhesive layer 121, and the exfoliation force between the base film 120 and the carrier film 130 may preferably be 3 to 10 gf/in, more preferably, 4 to 9 gf/in. When the exfoliation force between the base film 120 and the carrier film 130 does not satisfy the above ranges, exfoliation between the base film 120 and the carrier film 130 may occur when exfoliating the liner film 110, and exfoliation between the OLED panel and the base film 120 may occur when exfoliating the carrier film 130 from the base film 120.

The second adhesive layer 131 included in the carrier film 130 according to the present disclosure may include an antistatic agent to prevent generation of static electricity. By including the antistatic agent, generation of static electricity may be prevented, and alignment process workability may be enhanced.

As the second adhesive layer 131 included in the carrier film 130, any material for typically forming an adhesive layer in the art may be used without limitation, and the second adhesive layer 131 may preferably be an acrylic adhesive layer. In addition, a thickness of the second adhesive layer 131 is not limited as long as the thickness is a thickness of an adhesive layer typically included in a protection film, and may preferably be 1 to 10 μm, more preferably, 2 to 9 μm.

Detailed description of the second adhesive layer 131 will be provided with reference to a manufacturing method which will be described later.

Any material that is typically used in a protection film in the art may be used as the second base material 132 without limitation, and preferably, a PET base material may be used. Also, a thickness of the second base material 132 is not limited as long as the thickness is a thickness of a base material that may be typically used in a protection film, and may preferably be 20 to 60 μm, more preferably 25 to 55 μm, but is not limited thereto.

Meanwhile, to prevent generation of static electricity, at least a surface of the second base material 132 included in the carrier film 130 according to the present disclosure, preferably a lower surface thereof, may be antistatic treated. Through antistatic treatment, generation of static electricity may be prevented, and alignment process workability may be enhanced.

The bottom protection film for an OLED panel described above may be manufactured using a manufacturing method to be described later, but is not limited thereto.

The bottom protection film for an OLED panel, according to the present disclosure may be manufactured using a method including: manufacturing a base film 120 by forming a first adhesive layer 121 by coating and curing a first adhesive composition including a first main agent resin on an upper surface of a first base material 122; manufacturing a carrier film 130 by forming a second adhesive layer 131 by coating and curing a second adhesive composition including a second main agent resin on an upper surface of a second base material 132; laminating the base film 120 on an upper surface of the carrier film 130; and laminating the liner film 110 on the laminated base film to manufacture a bottom protection film for an OLED panel.

First, an operation of manufacturing the base film 120 by forming the first adhesive layer 121 by coating and curing a first adhesive composition including a first main agent resin on an upper surface of the first base material 122 will be described.

The first adhesive composition may include a first main agent resin, and may further include a first curing agent, a solvent, and an antistatic agent.

The first main agent resin may be any resin that may be typically used for forming an adhesive layer having a sufficient adhesion, and may preferably be an acrylic resin, and more preferably, polybutyl methacrylate.

The first main agent resin may have a weight average molecular weight of 200,000 to 1,000,000, and preferably, a weight average molecular weight of 400,000 to 800,000. When the weight average molecular weight of the first main agent resin is less than 200,000, a modulus of the first adhesive layer may be greater than a targeted modulus, and when the weight average molecular weight of the first main agent resin exceeds 1,000,000, a desired level of modulus may not be obtained.

Also, the first curing agent may be any curing agent that may be used in forming an adhesive layer exhibiting typically sufficient adhesion, without limitation, and preferably, an epoxy curing agent may be used, and more preferably, an epoxyamine curing agent may be used, and even more preferably, N,N,N,N'-tetraglycidyl-m-xylylenediamine may be used. The first curing agent may be included in an amount of 0.02 to 0.08 parts by weight, preferably, 0.03 to 0.07 parts by weight, based on 100 parts by weight of the first main agent resin. When the content of the first curing agent is less than 0.02 parts by weight based on 100 parts by weight of the first main agent resin, the first adhesive layer may not be cured to a target level, and a desired level of modulus may not be obtained, and when the content of the first curing agent exceeds 0.08 parts by weight, the first adhesive layer may be excessively cured to lower the adhesion, and the modulus may be greater than a desired level.

Also, the solvent is not particularly limited as long as it is a solvent that can be used in an adhesive composition for typically forming an adhesive layer, and may preferably include one or more selected from the group consisting of an aqueous solvent, an alcohol solvent, a ketone solvent, an amine solvent, an ester solvent, an acetate solvent, an amide solvent, a halogenated hydrocarbon solvent, an ether solvent, and a furan solvent, and more preferably, one or more selected from the group consisting of an alcohol solvent, a ketone solvent, an amine solvent, an ester solvent, an acetate solvent, and an ether solvent, and may be most preferably methyl ethyl ketone. The solvent may be included, but is not limited to, in an amount of 35 to 55 parts by weight, preferably 40 to 50 parts by weight, based on 100 parts by weight of the first main agent resin.

The antistatic agent may be any material without limitation as long as it prevents static electricity, and preferably, a pyridine antistatic agent may be used. The antistatic agent may be included in an amount of 0.5 to 5 parts by weight, preferably, 1 to 4 parts by weight based on 100 parts by weight of the first main agent resin. When the antistatic agent does not satisfy the above ranges, targeted antistatic effects may not be exhibited.

The base film 120 may be manufactured by forming the first adhesive layer 121 by coating and curing the first adhesive composition described above on the upper surface of the first base material 122 having a lower surface that is antistatic treated.

Next, an operation of manufacturing the carrier film 130 by forming the second adhesive layer 131 by coating and curing a second adhesive composition including a second main agent resin, on an upper surface of the second base material 132 will be described.

The second adhesive composition may include a second main agent resin, and may further include a second curing agent, a solvent, and an antistatic agent.

The second main agent resin may be any resin that may be typically used for forming an adhesive layer having a relatively small adhesion compared with the first adhesive layer, without limitation, and may preferably be an acrylic resin, and more preferably, polymethyl methacrylate, even more preferably, polymethyl methacrylate having a weight average molecular weight of 5,000 to 170,000, and most preferably, polymetyl methacrylate having a weight average molecular weight of 50,000 to 150,000.

Also, the second curing agent may be any curing agent that may be used for forming an adhesive layer that exhibits a relatively low adhesion compared with the first adhesive layer, without limitation, and preferably, an isocyanate curing agent may be used. The second curing agent may be included in an amount of 2 to 8 parts by weight, preferably, 3 to 7 parts by weight, based on 100 parts by weight of the second main agent resin. When the content of the second curing agent is less than 2 parts by weight based on 100 parts by weight of the second main agent resin, the second adhesive layer may not be cured to a target level, and when the content of the second curing agent exceeds 8 parts by weight, the second adhesive layer may be excessively cured to lower the adhesion.

Also, the solvent is not particularly limited as long as it is a solvent that can be used in an adhesive composition for typically forming an adhesive layer, and may preferably include one or more selected from the group consisting of an aqueous solvent, an alcohol solvent, a ketone solvent, an amine solvent, an ester solvent, an acetate solvent, an amide solvent, a halogenated hydrocarbon solvent, an ether solvent, and a furan solvent, and more preferably, one or more selected from the group consisting of an alcohol solvent, a ketone solvent, an amine solvent, an ester solvent, an acetate solvent, and an ether solvent, and may be most preferably methyl ethyl ketone. The solvent may be included, but is not limited to, in an amount of 60 to 80 parts by weight, preferably 65 to 75 parts by weight, based on 100 parts by weight of the second main agent resin.

Also, the antistatic agent may be any material as long as it prevents static electricity, and preferably, a pyridine antistatic agent may be used. The antistatic agent may be included in an amount of 0.1 to 0.4 parts by weight, preferably, 0.15 to 0.35 parts by weight, based on 100 parts by weight of the second main agent resin. When the antistatic agent does not satisfy the above ranges, targeted antistatic effects may not be obtained.

Meanwhile, the second adhesive composition may further include a leveling agent and a wetting agent. The leveling agent and the wetting agent may be any material, without limitation, as long as they are typically used in forming an adhesive layer in the art. Preferably, the leveling agent may be polyacrylate, and the wetting agent may be polyether siloxane, but they are not limited thereto. In addition, the leveling agent may be included in an amount of 0.25 to 2.25 parts by weight, preferably, 0.5 to 2 parts by weight, based on 100 parts by weight of the second main agent resin, and the wetting agent may be included in an amount of 0.2 to 0.8 parts by weight, preferably, 0.3 to 0.7 parts by weight, based on 100 parts by weight of the second main agent resin, but they are not limited thereto.

The carrier film 130 may be manufactured by forming the second adhesive layer 131 by coating and curing the second adhesive composition described above to the upper surface of the second base material 132 having a lower surface that is antistatic treated.

Next, an operation of laminating the base film 120 on an upper surface of the carrier film 130 and an operation of laminating the liner film 110 on the laminated base film to manufacture a bottom protection film for an OLED panel will be described.

Any lamination method that is typically used in the art may be used, without limitation, to laminate the base film 120 on the upper surface of the carrier film 130. Lamination may be performed preferably by using a roll laminator at room temperature, but is not limited thereto.

Also, the liner film 110 may be used without limitation as long as a lamination method typically used in the art is used, and preferably, lamination may be performed at room temperature by using a roll laminator to manufacture a bottom protection film for an OLED panel, but the present disclosure is not limited thereto.

According to the present disclosure, a method of applying a bottom protection film for an OLED panel according to the present disclosure, to an OLED panel, is provided; in detail, a method of applying a bottom protection film for an OLED panel is provided, the method including: exfoliating a liner film from the bottom protection film for an OLED panel; attaching a base film and a carrier film, from which the liner film is exfoliated, to an OLED panel; and exfoliating the carrier film from the base film and the carrier film that are attached to the OLED panel.

First, a first alignment process may be performed to exfoliate the liner film from the bottom protection film for an OLED panel, and the liner film may be exfoliated from the bottom protection film for an OLED panel by irradiating light of a wavelength of 400 to 700 nm and sensing reflected light. Here, when the base film 120 and the carrier film 130 do not show an appropriate level of exfoliation force, instead of exfoliation of the liner film 110, exfoliation between the base film 120 and the carrier film 130 may occur, and this may increase a defect rate.

In addition, a second alignment process may be performed to attach, to the OLED panel, the base film 120 and the carrier film 130, from which the liner film 110 is exfoliated, and the base film 120 and the carrier film 130 may be attached to the OLED panel by irradiating light of a wavelength of 400 to 700 nm and sensing reflected light.

Next, a third alignment process may be performed to exfoliate the carrier film 130 from the base film 120 and the carrier film 130 that are attached to the OLED panel, and the bottom protection film for an OLED panel may be attached to the bottom of the OLED panel by exfoliating the carrier film 130 from the base film 120 and the carrier film 130 attached to the OLED panel by irradiating light of a wavelength of 400 to 700 nm and sensing reflected light.

Meanwhile, the present disclosure includes an organic light-emitting display device 10 implemented by including the above-described base film.

Figure 3:
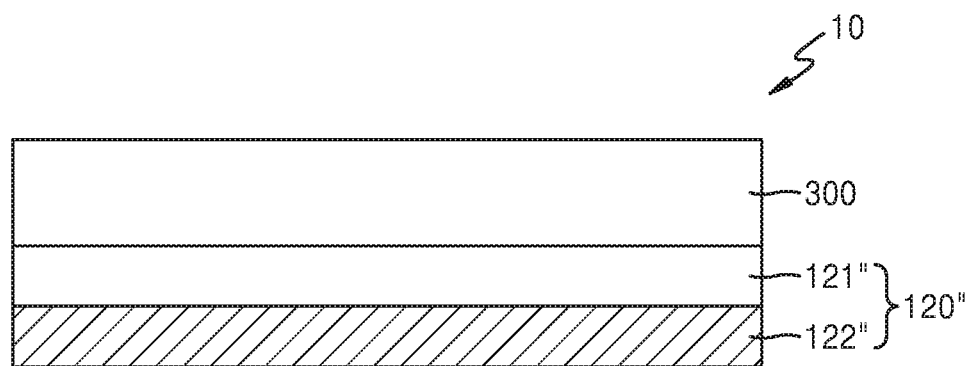
FIG. 3 is a cross-sectional view of an organic light-emitting display device according to an embodiment of the present disclosure.

As in FIG. 3, the organic light-emitting display device 10 may include the base film 120" attached to the bottom of an OLED panel 300. Here, the OLED panel 300 includes a substrate and an organic light-emitting device arranged on the substrate. The organic light-emitting device may be provided by stacking a first electrode, an intermediate layer including an organic emitting layer, and a second electrode. The base film 120" may be attached to the bottom of the substrate of the OLED panel 300. In detail, as the base film 120" including a first adhesive layer 121" having a sufficient adhesion and a first base material 122" having a function of protecting the OLED panel 300 is included, the bottom of the OLED panel 300 may be protected, and generation of static electricity in the OLED panel 300 may be prevented.

Meanwhile, according to the bottom protection film for an OLED panel of the present disclosure, excellent bending performance may be provided due to elasticity and impact resistance, and excellent alignment process workability may be provided, and excellent adhesion to an OLED panel, and the effect of preventing generation of static electricity through antistatic treatment may be provided at the same time.

The present disclosure will be described in more detail with reference to embodiments thereof below but the scope of the present disclosure is not limited by the embodiments, which shall be interpreted as being provided to help to understand the present disclosure.

EXAMPLE 1

(1) Manufacture of Base Film and Liner Film Lamination

A first adhesive composition was prepared by mixing polybutyl methacrylate (BURIM CHEMICAL, BA8900) having a weight average molecular weight of 600,000 as a first main agent resin, 0.05 parts by weight of N,N,N',N'-tetraglycidyl-m-xylenediamine (BURIM CHEMICAL, 45S) as a first curing agent, 2.5 parts by weight of a pyridine antistatic agent (KOEI, IL-P14-2) as an antistatic agent, and 45 parts by weight of methyl ethyl ketone (MEK) as a solvent, based on 100 parts by weight of the first main agent resin.

A base film was manufactured by coating the first adhesive composition on an upper surface of the first base material that is antistatic-treated by coating a thin film of PEDOT/PSS (poly (3,4-ethylenedioxythiophene) polystyrene sulfonate) on a lower surface of a PET base material having a thickness of 75 μm, and an upper surface and the lower surface of the PET base material having a thickness of 75 μm were coated with a thin film of PEDOT/PSS (poly (3,4-ethylenedioxythiophene) polystyrene sulfonate) to antistatic-treat the PET base material, and a thin film of a silicon releasing agent was coated on a lower surface of a liner film to silicon release-treat the liner film, and then the liner film is laminated using a roll laminator at room temperature and cured at 50° C. for 48 hours to manufacture the base film including the first adhesive layer having a thickness of 13 μm and the liner film stacked on the base film.

(2) Manufacture of Carrier Film

A second adhesive composition was prepared by mixing polymethyl methacrylate (SUSAN POLYMER Co., Ltd., SA609) having a weight average molecular weight of 100,000 as a second main agent resin, 5 parts by weight of polyisocyanate (SUSAN POLYMER Co., Ltd., SAX802) as a second curing agent, 0.25 parts by weight of a pyridine antistatic agent (KOEI, IL-P14-2) as an antistatic agent, 1.25 parts by weight of polyacrylate (BYK, BYK361 N) as a leveling agent, polyether siloxane (TEGO, WET270) as a wetting agent, and 70 parts by weight of methyl ethyl ketone (MEK) as a solvent, based on 100 parts by weight of the second main agent resin.

The second adhesive composition was coated on the upper surface of the second base material that is antistatic-treated by coating a thin film of PEDOT/PSS (poly (3,4-ethylenedioxythiophene) polystyrene sulfonate) on a lower surface of a PET base material having a thickness of 38 μm, and cured at 50° C. for 48 hours to prepare a carrier film including a second adhesive layer having a thickness of 5 μm.

(3) Manufacture of OLED Bottom Protection Film

The base film and the carrier film that are laminated with the liner film were laminated at 25° C. by using a roll laminator to manufacture an OLED bottom protection film.

EXAMPLES 2 THROUGH 14 AND COMPARATIVE EXAMPLES 1 THROUGH 6

An OLED panel bottom protection film as shown in Tables 1 through 4 was manufactured in the same manner as Example 1 except for by modifying conditions such as the weight average molecular weight of the first main agent resin or the second main agent resin, the content of the first curing agent and the second curing agent, and whether or not to perform release treatment on the lower surface of the liner film as shown in Tables 1 through 4.

<Experimental Example>

1. Measurement of Modulus (Modulus of Elasticity) according to Temperature

The first adhesive composition according to Examples and Comparative Examples was respectively coated on a heavy exfoliation liner (SKC Haas, RT81N) having an exfoliation force of 100 gf, and a light exfoliation liner (SKC, SG31) having an exfoliation force of 30 gf was laminated on the heavy exfoliation liner coated with the first adhesive composition, at room temperature by using a roll laminator, and then the laminated liners were cured at 50° C. for 48 hours to prepare a modulus measurement sample including a first adhesive layer having a thickness of 100 μm. The prepared modulus measurement sample was punched into a circle having a diameter of 8 mm, and the light exfoliation liner was removed, and the sample was attached to a parallel plate having a diameter of 8 mm and the heavy exfoliation liner was removed.

Next, by using a rheometer (TA instrument, ARES G2) as a modulus measurement device, a storage modulus and a loss modulus according to temperature were measured under the condition of an axial force of 0.5 N, a start temperature of −40° C., an end temperature of 150° C., a ramp rate of 10° C./min, a strain of 1%, and a frequency of 1 Hz. The storage modulus and the loss modulus respectively at 25° C., 50° C., and 85° C. are shown in Tables 1 through 4 below.

2. Evaluation of Releasing Force, Adhesion, and Exfoliation Force

Regarding the bottom protection film for an OLED panel manufactured according to Examples and Comparative Examples, a 1 inch width of the bottom protection film for an OLED panel was cut and then the bottom protection film was exfoliated at 180° at a rate of 40 mm per second to measure a liner releasing force. A 1 inch width of the bottom protection film for an OLED panel was cut to remove the liner film. Then the bottom protection film was attached to glass having a cleaned surface, and exfoliated, after 24 hours, at a rate of 5 mm per second at 180° to measure an adhesion of the first adhesive layer. A 1 inch width of each of the base film and the carrier film was cut and the carrier film was exfoliated at 180° at a rate of 40 mm per second to measure an exfoliation force between the base film and the carrier film. The measurement result is shown in Tables 1 through 4.

3. Evaluation of Impact Resistance

The bottom protection film for an OLED panel manufactured according to the Examples and Comparative Examples was attached to glass by using a roll laminator, and, after 24 hours, a spherical weight having a weight of 100 g was dropped on the surface of the bottom protection film from a height of 10 cm. Impact resistance was evaluated by marking—◯ when no bubbles were formed between the adhesive layer and the glass, and marking—X when bubbles were formed. The evaluation results are shown in Tables 1 through 4 below.

4. Evaluation of Bending Performance

Two end portions of the base films respectively manufactured according to the Examples and Comparative Examples were fixed to a jug of a bending testing apparatus (CAS, DLDMLH-FS), and a value r corresponding to bending of a base film center was set to 3 mm and the test was repeated 20,000 times to evaluate the bending performance. The bending performance was evaluated by analyzing whether bubbles were formed between an adhesive on the bent surface and the PET base material and when the bubbles were formed during the repeated tests, marking—◉ when the number of times that bubbles occurred exceeded 20,000 times, by marking—○ when the number of times that bubbles occurred was 20,000 times or less and exceeded 10,000 times, by marking—Δ when the number of times that bubbles occurred was 10,000 times or less or exceeded 5,000 times, and by marking—X when the number of times that bubbles occurred was 5,000 times or less. The evaluation results are shown in Tables 1 through 4.

5. Evaluation of Workability of Alignment Process

Workability of an operation of aligning the bottom protection film manufactured according to Examples and Comparative Examples, to an OLED panel, was evaluated.

In the first alignment process of exfoliating the liner film from the bottom protection film for an OLED panel, when exfoliating the liner film, workability of the first alignment process was evaluated by marking—◯ when only the liner film was exfoliated and marking—X when exfoliation between the base film and the carrier film was generated. Also, workability of the carrier film removing operation (third alignment process) was evaluated by marking—◯ when the carrier film was exfoliated by performing the exfoliation once and by marking—X when the carrier film was exfoliated by performing the exfoliation twice or more in the operation of exfoliating the carrier film from the base film and the carrier film attached to the OLED panel. The evaluation results are shown in Tables 1 through 4 below.

6. Adhesive Performance of Bottom Protection Film for an OLED panel

The bottom protection film for an OLED panel manufactured according to Examples and Comparative Examples was attached to an OLED panel at room temperature by using a roll laminator, and after 24 hours, the bottom protection film for an OLED panel was left at a temperature of 60° C. and a humidity of 90% and for 500 hours to identify whether the attached bottom protection film was exfoliated. The adhesive performance of the base film was evaluated by marking—◯ when exfoliation did not occur and marking—X when exfoliation occurred. The evaluation results are shown in Tables 1 through 4.

TABLE 1

| division | | Example 1 | Example 2 | Example 3 | Example 4 | Example 5 |
|---|---|---|---|---|---|---|
| first adhesive composition | weight average molecular weight of first main agent resin | 600,000 | 400,000 | 800,000 | 600,000 | 600,000 |
| | content of first curing agent (part by weight) | 0.05 | 0.05 | 0.05 | 0.03 | 0.07 |
| second adhesive composition | weight average molecular weight of second main agent resin | 100,000 | 100,000 | 100,000 | 100,000 | 100,000 |
| | content of second curing agent (part by weight) | 5 | 5 | 5 | 5 | 5 |
| whether release treatment is performed on lower surface of liner film | | ○ | ○ | ○ | ○ | ○ |
| 25° C. | storage modulus (Pa) | 24078.1 | 25634.5 | 22618.9 | 23113.7 | 25197.6 |
| | loss modulus (Pa) | 12004 | 15943.8 | 8430.3 | 9046.6 | 15436.5 |
| | Condition (1) | 0.4985443 | 0.621966 | 0.37271 | 0.391396 | 0.6126179 |
| 50° C. | storage modulus (Pa) | 36952.6 | 38151.3 | 35086.1 | 35842.9 | 37895.4 |
| | loss modulus (Pa) | 13521.1 | 16919.3 | 10614.6 | 11834.8 | 16322 |
| | Condition (2) | 0.3659039 | 0.443479 | 0.30253 | 0.330185 | 0.4307119 |
| 85° C. | storage modulus (Pa) | 48628.2 | 50079 | 47144.3 | 47798.6 | 49321.3 |
| | loss modulus (Pa) | 22685.8 | 26323.1 | 19573.1 | 20198.2 | 25817.8 |
| | Condition (3) | 0.4665153 | 0.525632 | 0.415174 | 0.422569 | 0.5234615 |
| releasing force of liner film (gf/in) | | 3.2 | 3.2 | 3.2 | 3.2 | 3.2 |
| adhesion of first adhesive layer (gf/in) | | 1680 | 1029 | 2263 | 2049 | 1301 |
| exfoliation force of base film/carrier film (gf/in) | | 6.6 | 6.6 | 6.6 | 6.6 | 6.6 |
| base film | impact resistance | ○ | ○ | ○ | ○ | ○ |
| | bending performance | ◎ | ◎ | ◎ | ◎ | ◎ |
| workability | first alignment | ○ | ○ | ○ | ○ | ○ |
| | third alignment | ○ | ○ | ○ | ○ | ○ |
| adhesive performance of base film | | ○ | ○ | ○ | ○ | ○ |

TABLE 2

| division | | Example 6 | Example 7 | Example 8 | Example 9 | Example 10 |
|---|---|---|---|---|---|---|
| first adhesive composition | weight average molecular weight of first main agent resin | 600,000 | 600,000 | 600,000 | 600,000 | 600,000 |
| | Content of first curing agent (part by weight) | 0.05 | 0.05 | 0.05 | 0.05 | 0.05 |
| second adhesive composition | weight average molecular weight of second main agent resin | 4,000 | 50,000 | 150,000 | 220,000 | 100,000 |

TABLE 2-continued

| division | | Example 6 | Example 7 | Example 8 | Example 9 | Example 10 |
|---|---|---|---|---|---|---|
| | Content of second curing agent (part by weight) | 5 | 5 | 5 | 5 | 1 |
| | whether release treatment is performed on lower surface of liner film | ○ | ○ | ○ | ○ | |
| 25° C. | storage modulus (Pa) | 24078.1 | 24078.1 | 24078.1 | 24078.1 | 24078.1 |
| | loss modulus (Pa) | 12004 | 12004 | 12004 | 12004 | 12004 |
| | Condition (1) | 0.4985443 | 0.498544 | 0.498544 | 0.498544 | 0.4985443 |
| 50° C. | storage modulus (Pa) | 36952.6 | 36952.6 | 36952.6 | 36952.6 | 36952.6 |
| | loss modulus (Pa) | 13521.1 | 13521.1 | 13521.1 | 13521.1 | 13521.1 |
| | Condition (2) | 0.3659039 | 0.365904 | 0.365904 | 0.365904 | 0.3659039 |
| 85° C. | storage modulus (Pa) | 48628.2 | 48628.2 | 48628.2 | 48628.2 | 48628.2 |
| | loss modulus (Pa) | 22685.8 | 22685.8 | 22685.8 | 22685.8 | 22685.8 |
| | Condition (3) | 0.4665153 | 0.466515 | 0.466515 | 0.466515 | 0.4665153 |
| releasing force of liner film (gf/in) | | 3.2 | 3.2 | 3.2 | 3.2 | 3.2 |
| adhesion of first adhesive layer (gf/in) | | 1680 | 1680 | 1680 | 1680 | 1680 |
| exfoliation force of base film/carrier film (gf/in) | | 1.3 | 4.1 | 8.8 | 12.2 | 8.3 |
| base film | impact resistance | ○ | ○ | ○ | ○ | ○ |
| | bending performance | ◎ | ◎ | ◎ | ◎ | ◎ |
| workability | first alignment | X | ○ | ○ | ○ | ○ |
| | third alignment | ○ | ○ | ○ | X | X |
| adhesive performance of base film | | ○ | ○ | ○ | ○ | ○ |

TABLE 3

| Division | | Example 11 | Example 12 | Example 13 | Example 14 | Comparative example 1 |
|---|---|---|---|---|---|---|
| first adhesive composition | weight average molecular weight of first main agent resin | 600,000 | 600,000 | 600,000 | 600,000 | 100,000 |
| | content of first curing agent (part by weight) | 0.05 | 0.05 | 0.05 | 0.05 | 0.05 |
| second adhesive composition | weight average molecular weight of second main agent resin | 100,000 | 100,000 | 100,000 | 100,000 | 100,000 |
| | content of second curing agent (part by weight) | 3 | 7 | 10 | 5 | 5 |
| whether release treatment is performed on lower surface of liner film | | ○ | ○ | ○ | X | ○ |
| 25° C. | storage modulus (Pa) | 24078.1 | 24078.1 | 24078.1 | 24078.1 | 29137.8 |
| | loss modulus (Pa) | 12004 | 12004 | 12004 | 12004 | 20394.8 |
| | Condition (1) | 0.4985443 | 0.498544 | 0.498544 | 0.498544 | 0.699943 |

TABLE 3-continued

| Division | | Example 11 | Example 12 | Example 13 | Example 14 | Comparative example 1 |
|---|---|---|---|---|---|---|
| 50° C. | storage modulus (Pa) | 36952.6 | 36952.6 | 36952.6 | 36952.6 | 40032.4 |
| | loss modulus (Pa) | 13521.1 | 13521.1 | 13521.1 | 13521.1 | 21914.4 |
| | Condition (2) | 0.3659039 | 0.365904 | 0.365904 | 0.365904 | 0.5474166 |
| 85° C. | storage modulus (Pa) | 48628.2 | 48628.2 | 48628.2 | 48628.2 | 52180.8 |
| | loss modulus (Pa) | 22685.8 | 22685.8 | 22685.8 | 22685.8 | 31774.2 |
| | Condition (3) | 0.4665153 | 0.466515 | 0.466515 | 0.466515 | 0.6089251 |
| releasing force of liner film (gf/in) | | 3.2 | 3.2 | 3.2 | 9.8 | 3.2 |
| adhesion of first adhesive layer (gf/in) | | 1680 | 1680 | 1680 | 1680 | 207 |
| exfoliation force of base film/carrier film (gf/in) | | 8.4 | 4.3 | 1.6 | 6.6 | 6.6 |
| base film | impact resistance | ○ | ○ | ○ | ○ | ○ |
| | bending performance | ◎ | ◎ | ◎ | ◎ | Δ |
| workability | first alignment | ○ | ○ | X | X | ○ |
| | third alignment | ○ | ○ | ○ | ○ | ○ |
| adhesive performance of base film | | ○ | ○ | ○ | ○ | X |

TABLE 4

| Division | | Comparative example 2 | Comparative example 3 | Comparative example 4 | Comparative example 5 | Comparative example 6 |
|---|---|---|---|---|---|---|
| first adhesive composition | weight average molecular weight of first main agent resin | 1,300,000 | 600,000 | 600,000 | 100,000 | 1,300,000 |
| | content of first curing agent (part by weight) | 0.05 | 0.01 | 0.1 | 0.1 | 0.01 |
| second adhesive composition | weight average molecular weight of second main agent resin | 100,000 | 100,000 | 100,000 | 100,000 | 100,000 |
| | content of second curing agent (part by weight) | 5 | 5 | 5 | 5 | 5 |
| | whether release treatment is performed on lower surface of liner film | ○ | ○ | ○ | ○ | ○ |
| 25° C. | storage modulus (Pa) | 19408.6 | 20162.5 | 28610.1 | 32517 | 17861.3 |
| | loss modulus (Pa) | 6716.5 | 7226.7 | 19884.6 | 26221.3 | 4877.1 |
| | Condition (1) | 0.3460579 | 0.358423 | 0.69502 | 0.806387 | 0.273054 |
| 50° C. | storage modulus (Pa) | 32814 | 33415.6 | 39478.9 | 44273.1 | 28289.7 |
| | loss modulus (Pa) | 7012.4 | 7506.4 | 21216.8 | 25101.2 | 6168 |
| | Condition (2) | 0.2137015 | 0.224638 | 0.537421 | 0.566963 | 0.2180299 |

TABLE 4-continued

| Division | | Comparative example 2 | Comparative example 3 | Comparative example 4 | Comparative example 5 | Comparative example 6 |
|---|---|---|---|---|---|---|
| 85° C. | storage modulus (Pa) | 44419.1 | 45116.1 | 51337.9 | 55916.3 | 41113.4 |
| | loss modulus (Pa) | 15001.2 | 15910.8 | 31110.5 | 35543.7 | 12159.8 |
| | Condition (3) | 0.3377196 | 0.352663 | 0.605995 | 0.635659 | 0.2957625 |
| releasing force of liner film (gf/in) | | 3.2 | 3.2 | 3.2 | 3.2 | 3.2 |
| adhesion of first adhesive layer (gf/in) | | 3586 | 2418 | 561 | 169 | 4166 |
| base film/carrier film exfoliation force (gf/in) | | 6.6 | 6.6 | 6.6 | 6.6 | 6.6 |
| base film | impact resistance | X | X | ○ | ○ | X |
| | bending performance | X | X | ○ | X | X |
| workability | first alignment | ○ | ○ | ○ | ○ | ○ |
| | third alignment | ○ | ○ | ○ | ○ | ○ |
| | adhesive performance of base film | ○ | ○ | X | X | ○ |

As shown in Tables 1 through 4,

Examples 1 through 5, 7, 8, 11, and 12 that satisfy the preferable conditions according to the present disclosure, which are related to the weight average molecular weight of the first main agent resin, the second main agent resin, the content of the first curing agent, the second curing agent, and whether the lower surface of the liner film is release-treated, show excellent impact resistance, bending performance, and alignment process workability and also excellent adhesive performance of the base film compared to Examples 6, 9, 10, 13, 14, and Comparative Examples 1 through 6 that do not meet the above conditions.

In detail, Examples 1, 7, and 8 that satisfy the weight average molecular weight of the second main agent resin according to the present disclosure exhibited excellent alignment process workability compared to Examples 6 and 9 in which the weight average molecular weight of the second main agent resin was not met.

In addition, in Examples 1, 11, and 12 that satisfy the content of the second curing agent according to the present disclosure, better workability of the alignment process compared to Examples 10 and 13, which did not satisfy the condition related to the content of the second curing agent, was exhibited.

In addition, in Example 1 in which the release treatment was performed on the lower surface of the liner film, better workability of the alignment process compared to Example 14 in which a release treatment was not performed, was exhibited.

In detail, Examples 1 through 3 that satisfy the weight average molecular weight of the first main agent resin according to the present disclosure exhibited excellent bending performance and excellent adhesive performance of the base film compared to Comparative Example 1 in which the weight average molecular weight of the first main agent resin was not met, and also, excellent impact resistance and bending performance were shown compared to Comparative Example 2.

In addition, Examples 1, 4, and 5 that satisfy the content of the first curing agent according to the present disclosure showed excellent impact resistance and bending performance compared to Comparative Example 3 which does not satisfy the same, and showed excellent bending performance and excellent adhesive performance of the base film compared to Comparative Example 4.

In addition, Examples 1 through 5 that satisfy the weight average molecular weight of the first main agent resin and the content of the first curing agent according to the present disclosure showed excellent bending performance and excellent adhesive performance of the base film compared to Comparative Example 5 which satisfies neither of the two, and showed excellent impact resistance and bending performance compared to Comparative Example 6.

While the present disclosure has been particularly shown and described with reference to exemplary embodiments thereof, it is to be understood that the present disclosure is not limited to the disclosed exemplary embodiments. It will be understood by those skilled in the art that various changes such as addition, modification, elimination, or supplementation may be made therein to easily suggest other embodiments, without departing from the spirit and scope of the disclosure as defined by the appended claims.

The invention claimed is:

1. A bottom protection film for an OLED panel, comprising:
a base film comprising a first adhesive layer on an upper surface of a first base material;
a carrier film comprising a second adhesive layer adhered to a lower surface of the first base material and a second base material adhered to a lower surface of the second adhesive layer; and
a liner film adhered utilizing the first adhesive layer,
wherein the first adhesive layer satisfies all of Conditions (1), (2), and (3) below:

$$\text{at } 25°\text{C.}, 0.28 \leq \frac{\text{loss modulus (Pa)}}{\text{storage modulus (Pa)}} \leq 0.8, \quad (1)$$

$$\text{at } 50°\text{C.}, 0.23 \leq \frac{\text{loss modulus (Pa)}}{\text{storage modulus (Pa)}} \leq 0.53, \quad (2)$$

-continued $$\text{at } 85°\text{C.}, 0.35 \leq \frac{\text{loss modulus (Pa)}}{\text{storage modulus (Pa)}} \leq 0.6, \quad (3)$$

wherein the first adhesive layer has, at 25° C., a storage modulus of 20,000 to 28,000 Pa and a loss modulus of 8,000 to 16,000 Pa.

2. The bottom protection film for an OLED panel of claim 1, wherein the first adhesive layer satisfies all of Conditions (4), (5), and (6) below:

$$\text{at } 25°\text{C.}, 0.36 \leq \frac{\text{loss modulus (Pa)}}{\text{storage modulus (Pa)}} \leq 0.65, \quad (4)$$

$$\text{at } 50°\text{C.}, 0.28 \leq \frac{\text{loss modulus (Pa)}}{\text{storage modulus (Pa)}} \leq 0.46, \quad (5)$$

$$\text{at } 85°\text{C.}, 0.39 \leq \frac{\text{loss modulus (Pa)}}{\text{storage modulus (Pa)}} \leq 0.54. \quad (6)$$

3. The bottom protection film for an OLED panel of claim 1, wherein the first adhesive layer has, at 50° C., a storage modulus of 33,000 to 41,000 Pa and a loss modulus of 9,500 to 17,500 Pa.

4. The bottom protection film for an OLED panel of claim 1, wherein the first adhesive layer has, at 85° C., a storage modulus of 44,500 to 52,500 Pa and a loss modulus of 18,500 to 26,500 Pa.

5. The bottom protection film for an OLED panel of claim 1, wherein the first base material and the second base material are each a PET base material, and
the first adhesive layer and the second adhesive layer are acrylic adhesive layers.

6. The bottom protection film for an OLED panel of claim 1, wherein a lower surface of the liner film is silicon release treated.

7. The bottom protection film for an OLED panel of claim 1, wherein at least one surface of each of the liner film, the first base material, and the second base material is antistatic treated.

8. The bottom protection film for an OLED panel of claim 1, wherein the first adhesive layer and the second adhesive layer comprise an antistatic agent.

9. The bottom protection film for an OLED panel of claim 1, wherein the first adhesive layer has a thickness of 10 to 30 μm, and the first base material has a thickness of 65 to 140 μm.

10. The bottom protection film for an OLED panel of claim 1, wherein the liner film has a thickness of 55 to 95 μn,
wherein the second adhesive layer has a thickness of 1 to 10 μm, and
wherein the second base material has a thickness of 20 to 60 μm.

11. The bottom protection film for an OLED panel of claim 1, wherein a releasing force of the liner film is 5 gf/in (1.93 N/m) or less.

12. The bottom protection film for an OLED panel of claim 1, wherein adhesion of the first adhesive layer measured by using a measurement method below is 250 gf/in (96.52 N/m) or higher,
wherein in the measurement method, the first adhesive layer was adhered to glass, and, after 24 hours, adhesion of the first adhesive layer was measured when the first adhesive layer was exfoliated at 180° at a rate of 5 mm per second.

13. The bottom protection film for an OLED panel of claim 1, wherein an exfoliation force between the base film and the carrier film is 3 to 10 gf/in (1.16 to 3.86 N/m).

14. A method of applying a bottom protection film for an OLED panel, the method comprising:
exfoliating a liner film from the bottom protection film;
attaching a base film and a carrier film, from which the liner film is exfoliated, to the OLED panel; and
exfoliating the carrier film from the base film and the carrier film that are attached to the OLED panel,
wherein the bottom protection film comprises:
the base film comprising a first adhesive layer on an upper surface of a first base material;
the carrier film comprising a second adhesive layer adhered to a lower surface of the first base material and a second base material adhered to a lower surface of the second adhesive layer; and
a liner film adhered utilizing the first adhesive layer,
wherein the first adhesive layer satisfies all of Conditions (1), (2), and (3) below:

$$\text{at } 25°\text{C.}, 0.28 \leq \frac{\text{loss modulus (Pa)}}{\text{storage modulus (Pa)}} \leq 0.8, \quad (1)$$

$$\text{at } 50°\text{C.}, 0.23 \leq \frac{\text{loss modulus (Pa)}}{\text{storage modulus (Pa)}} \leq 0.53, \quad (2)$$

$$\text{at } 85°\text{C.}, 0.35 \leq \frac{\text{loss modulus (Pa)}}{\text{storage modulus (Pa)}} \leq 0.6, \quad (3)$$

wherein the first adhesive layer has, at 25° C., a storage modulus of 20,000 to 28,000 Pa and a loss modulus of 8,000 to 16,000 Pa.

15. An organic light-emitting display device comprising a base film and an OLED panel,
wherein the OLED panel comprises a substrate and an organic light-emitting device on the substrate, and
the base film comprises a base material and an adhesive layer on an upper surface of the base material, and
the adhesive layer satisfies all of Conditions (1), (2), and (3):

$$\text{at } 25°\text{C.}, 0.28 \leq \frac{\text{loss modulus (Pa)}}{\text{storage modulus (Pa)}} \leq 0.8, \quad (1)$$

$$\text{at } 50°\text{C.}, 0.23 \leq \frac{\text{loss modulus (Pa)}}{\text{storage modulus (Pa)}} \leq 0.53, \quad (2)$$

$$\text{at } 85°\text{C.}, 0.35 \leq \frac{\text{loss modulus (Pa)}}{\text{storage modulus (Pa)}} \leq 0.6, \quad (3)$$

wherein the first adhesive layer has, at 25° C., a storage modulus of 20,000 to 28,000 Pa and a loss modulus of 8,000 to 16,000 Pa.

16. The organic light-emitting display device of claim 15, wherein the adhesive layer has, at 50° C., a storage modulus of 33,000 to 41,000 Pa, and a loss modulus of 9,500 to 17,500 Pa.

17. The organic light-emitting display device of claim 15, wherein the adhesive layer has, at 85° C., a storage modulus of 44,500 to 52,500 Pa, and a loss modulus of 18,500 to 26,500 Pa.

18. The organic light-emitting display device of claim 15, wherein adhesion of the adhesive layer measured by using a measurement method below is 250 gf/in (96.52 N/m) or higher:

wherein in the measurement method, the adhesive layer was adhered to glass, and, after 24 hours, adhesion of the adhesive layer was measured when the adhesive layer was exfoliated at 180° at a rate of 5 mm per second.

19. The organic light-emitting display device of claim 15, wherein the adhesive layer comprises an antistatic agent.

20. The organic light-emitting display device of claim 15, wherein at least one surface of the base material is antistatic treated.

21. The organic light-emitting display device of claim 15, wherein a thin film including (poly(3,4-ethylene dioxythiophene)-polystyrene sulfonate (PEDOT/PSS) is coated on a lower surface of the base material to be antistatic treated.

* * * * *